(12) United States Patent
Tsuda (10) Patent No.: US 8,420,300 B2
(45) Date of Patent: Apr. 16, 2013

(54) METHOD OF PRODUCING MULTILAYER PRINTED WIRING BOARD AND PHOTOSENSITIVE DRY FILM USED THEREFOR

(75) Inventor: Akiyoshi Tsuda, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/974,081

(22) Filed: Dec. 21, 2010

(65) Prior Publication Data

US 2011/0183267 A1   Jul. 28, 2011

Related U.S. Application Data

(62) Division of application No. 11/580,157, filed on Oct. 13, 2006.

(30) Foreign Application Priority Data

Oct. 14, 2005  (JP) ................................. 2005-299506

(51) Int. Cl.
*G03F 1/06* (2011.01)

(52) U.S. Cl.
USPC .............................. 430/315; 430/311; 29/825

(58) Field of Classification Search .................. 430/315, 430/311; 29/825
See application file for complete search history.

(56) References Cited

U.S. PATENT DOCUMENTS 5,015,555 A   5/1991  Lazaar

FOREIGN PATENT DOCUMENTS

| JP | 9-130050 | 5/1997 |
| JP | 10-193510 A | 7/1998 |
| JP | 2003-101220 | 4/2003 |
| JP | 2004-317874 | 11/2004 |
| JP | 2005-283939 A | 10/2005 |

OTHER PUBLICATIONS

Japanese Office Action issued on Feb. 8, 2011 in corresponding Japanese Application No. 2005-299506.

*Primary Examiner* — Daborah Chacko Davis
(74) *Attorney, Agent, or Firm* — Oblon, Spivak, McClelland, Maier & Neustadt, L.L.P.

(57) ABSTRACT

A method of producing a multilayer printed wiring board by attaching a photosensitive dry film onto an interlaminar resin insulating layer having a thin-film conductor layer and conducting a light exposure and development to form a plating resist and then forming a conductor circuit on a portion not forming the plating resist. The photosensitive dry film has a nitrogen-containing heterocyclic compound layer on a first surface thereof.

7 Claims, 7 Drawing Sheets

METHOD OF PRODUCING MULTILAYER PRINTED WIRING BOARD AND PHOTOSENSITIVE DRY FILM USED THEREFOR

CROSS-REFERENCE TO RELATED APPLICATIONS

This application is a divisional of and claims benefit of priority from U.S. application Ser. No. 11/580,157, filed Oct. 13, 2006, the entire contents of which are hereby incorporated by reference. U.S. application Ser. No. 11/580,157 is based upon and claims the benefit of priority from the prior Japanese Patent Application No. 2005-299506, filed Oct. 14, 2005.

TECHNICAL FIELD

This invention relates to a method of producing a multilayer printed wiring board and a photosensitive dry film used for this production method.

RELATED ART

The multilayer printed wiring board called as a build-up multilayered printed wiring board is a package corresponding to the speeding-up and high integration of IC chips and is characterized in points that the electric resistance and dielectric constant are small and the weight reduction is excellent. The multilayer printed wiring board is produced by a semi-additive method or the like wherein conductor circuits of copper or the like and interlaminar resin insulating layers are alternately laminated on a resin substrate reinforced with a glass cloth or the like of about 0.6-1.5 mm called as a core.

Heretofore, the multilayer printed wiring board has been produced through the following steps disclosed in JP-A-H09-130050. That is, the multilayer printed wiring board is produced by
1) forming through-holes in a copper clad laminate;
2) forming a connecting path by subjecting the through-hole to an electroless copper plating treatment and an electrolytic copper plating treatment;
3) subjecting the surface of the laminate to an etching treatment to form a conductor circuit;
4) roughening the surface of the conductor circuit by electroless plating, etching or the like and thereafter forming an interlaminar resin insulating layer;
5) forming an opening for via-hole in the interlaminar resin insulating layer through light-exposing and developing treatment or a laser treatment;
6) UV-curing and full-curing the interlaminar resin insulating layer and subjecting the cured interlaminar resin insulating layer to a roughening treatment and then forming a thin electroless plated film on the roughened surface;
7) forming a plating resist on the electroless plated film and thickening the resist through electric plating, peeling off the plating resist and then etching to connect to an under-layer conductor circuit through the via-hole;
8) repeating the above steps and thereafter forming a solder resist layer for protecting the conductor circuit as an outermost layer, subjecting the conductor circuit in an opening portion formed in the solder resist layer to Au plating or the like to form a pad and forming a solder bump.

In the above production steps, the plating resist is formed by attaching a photosensitive dry film onto a thin-film conductor layer such as thin electroless plating film or the like and subjecting the photosensitive dry film to the light-exposing and developing treatment.

Figures 7A, 7B, 7C:
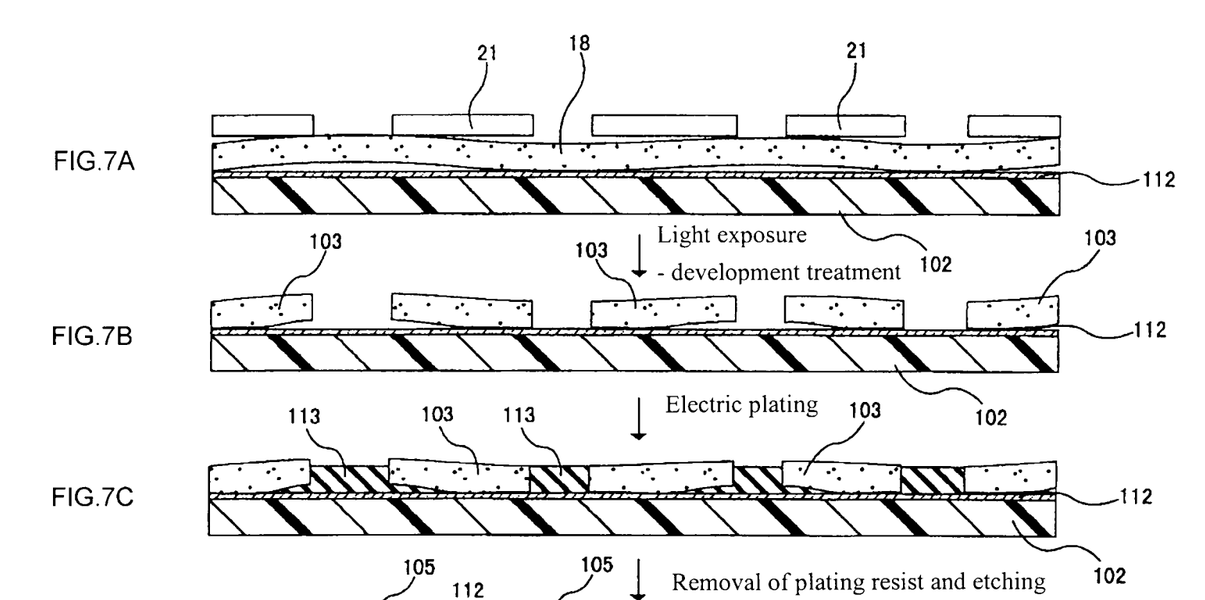
FIGS. 7A-7D are section views illustrating each part of production steps in the conventional multilayer printed wiring board.
Figure 7D:
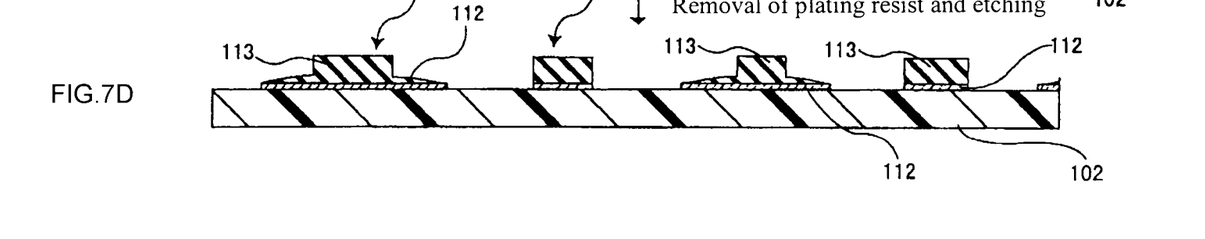

However, when the photosensitive dry film is directly attached onto the interlaminar resin insulating layer having the thin-film conductor layer on its surface, a part of the surface of the thin-film conductor layer may be modified by the oxidation or the like, and hence the properties of the surface of the thin-film conductor layer becomes not uniform. Also, since the wettability of the resin to a metal is poor, as shown in FIG. 7, when the photosensitive dry film 18 is directly attached onto the thin-film conductor layer 112, the swelling or the like may be easily caused in the photosensitive dry film 18 (see FIG. 7A). Therefore, when the plating resist 103 is formed by the light exposure-development treatment, the surface of the plating resist 103 becomes waved due to the swelling and a gap is generated in its bottom (see FIG. 7B). When the electric plated layer 113 is formed at this state, the gap portion in the bottom is also filled with the electric plated layer 113 (see FIG. 7C), so that when the conductor circuit 105 is formed by removing the plating resist 103 and the thin-film conductor layer 112, as shown in FIG. 7D, it may have a widened form of the bottom. Moreover, numeral 21 in FIG. 7A is a mask.

Such a problem is frequently caused in case of a conductor circuit wherein a bottom distance between the adjoining conductors is narrow and the short-circuiting is easily caused between the adjoining conductor circuits and particularly the conductor circuit having a narrow width such as L/S=35/35. Moreover, the L/S is a ratio of the width of the conductor circuit to distance between the conductor circuits (hereinafter referred to as L/S simply). In the conductor circuit of such a form, it is difficult to conduct the alignment of impedance of the multilayer printed wiring board, and there may be caused signal delay or signal error.

In order to solve the above problems, JP-A-2003-101220 discloses a method wherein the surface of the thin-film conductor layer is subjected to a drying treatment (plasma treatment, corona treatment, laser treatment, UV cleaning or the like for forming a new layer on the surface of the thin-film conductor layer) and a photosensitive dry film is attached thereto attain the uniformization and cleaning of the surface of the thin-film conductor layer, whereby the compatibility between the thin-film conductor layer and the photosensitive dry film is improved and the plating resist having a flat surface is formed without forming a gap at the bottom between the adjoining conductor circuits. Also, according to this method, there is no fear of causing the short-circuiting between the adjoining conductor circuits, and it is possible to provide a production method of multilayer printed wiring board having an excellent connection reliability without causing the signal delay or signal error.

SUMMARY OF THE INVENTION

The invention lies in a method of producing a multilayer printed wiring board by attaching a photosensitive dry film onto an interlaminar resin insulating layer having a thin-film conductor layer and conducting a light exposure and development to form a plating resist and then forming a conductor circuit on a portion not forming the plating resist, characterized in that the photosensitive dry film has a nitrogen-containing heterocyclic compound layer on its either surface.

According to the invention, as the photosensitive dry film used in the production of the multilayer printed wiring board, either surface of the photosensitive dry film has a nitrogen-containing heterocyclic compound layer.

In the invention, the nitrogen-containing heterocyclic compound layer can be formed with either one compound selected from pyrrole, imidazole, oxazole, thiazole, pirazole, 3-pyrroline, pyrrolidine, pyridine, pyrimidine, purine, quinoline, isoquinoline, carbazole, tetrazole, 5-aminotetrazole, triazole, aminotriazole, derivatives thereof and the like.

According to the production method of multilayer printed wiring board and the photosensitive dry film used therein of the invention, the compatibility between the thin-film conductor layer and the photosensitive dry film is improved and the adhesion force between the thin-film conductor layer and the photosensitive dry film is strengthened, so that when the photosensitive dry film is attached to the thin-film conductor layer, the swelling or the like is not caused in the photosensitive dry film and also the short-circuiting between the adjoining conductor circuits and the signal delay or signal error are not caused, and hence there can be produced a multilayer printed wiring board having an excellent connection reliability under heat cycle condition or high-temperature and high humidity condition.

DETAILED EXPLANATION OF PREFERRED EMBODIMENTS

The production method of the multilayer printed wiring board according to the invention comprises:
1) a step of attaching a photosensitive dry film onto an interlaminar resin insulating layer formed with a thin-film conductor layer;
2) a step of subjecting the photosensitive dry film to light exposure-development treatment to form a plating resist; and
3) a step of forming a conductor circuit(s) on a portion(s) not forming the plating resist, and is characterized in that when the photosensitive dry film attached to the thin-film conductor layer at the step 1), either surface of the film is previously coated with a nitrogen-containing heterocyclic compound and thereafter attached onto the surface of the thin-film conductor layer.

That is, when the nitrogen-containing heterocyclic compound is applied onto either surface of the photosensitive dry film, a polarized amino group in the nitrogen-containing heterocyclic compound and a polarized carboxyl group in the photosensitive dry film are attracted to each other, and when the photosensitive dry film is attached at such a state onto the thin-film conductor layer, a metal (Cu, Ni, P or the like) in the thin-film conductor layer is coordinate-bonded to a nitrogen (N) of the nitrogen-containing heterocyclic compound in the photosensitive dry film to improve the compatibility between the thin-film conductor layer and the photosensitive dry film, whereby the adhesion force between the thin-film conductor layer and the photosensitive dry film can be strengthened. As a result, when the photosensitive dry film is attached onto the thin-film conductor layer, the swelling or the like is not caused in the photosensitive dry film and a plating resist of a rectangular form adhered to the thin-film conductor layer can be formed.

In the invention, therefore, when the conductor circuit is formed on a portion not forming the plating resist after the formation of the plating resist, the resulting conductor circuit can have a rectangular form at its section and there is no fear of causing the short-circuiting between the adjoining conductor circuits, and hence there can be produced a multilayer printed wiring board not causing the signal delay or signal error and having an excellent connection reliability under heat cycle condition or under high-temperature-high humidity conditions.

In is preferable that the nitrogen-containing heterocyclic compound is previously applied onto either surface of the photosensitive dry film at a side at least contacting with the thin-film conductor layer. This is due to the fact that when the nitrogen-containing heterocyclic compound is applied to the photosensitive dry film, the nitrogen-containing heterocyclic compound is bonded to the dry film and then the nitrogen-containing heterocyclic compound and the dry film can be removed together from the substrate in the development of the dry film. On the other hand, if the nitrogen-containing heterocyclic compound is applied onto the thin-film conductor layer, the nitrogen-containing heterocyclic compound bonds to the thin-film conductor layer, so that it is difficult to remove the nitrogen-containing heterocyclic compound together with the dry film in the development of the dry film and the adhesion force between the thin-film conductor layer and the electric plated portion (conductor circuit) becomes undesirably lower.

Moreover, the nitrogen-containing heterocyclic compound is preferably at least one selected from pyrrole, imidazole, oxazole, thiazole, pirazole, 3-pyrroline, pyrrolidine, pyridine, pyrimidine, purine, quinoline, isoquinoline, carbazole, tetrazole, 5-aminotetrazole, triazole, aminotriazole, derivatives thereof and the like. Among these nitrogen-containing heterocyclic compounds, it is more preferable to use a compound selected from tetrazoles (1,2,3,4-tetrazole, 1,2,3,5-tetrazole), 5-amino tetrazole and 5-amino tetrazole derivatives, or a compound selected from triazoles (1,2,3-triazole, 1,2,4-triazole), 1-amino-1,2,3-triazole and 1-amino-1,2,3-triazole derivatives. Moreover, these compounds may include an isomer.

The 5-amino tetrazole derivative may be, for example, 5-amino-1-methyl tetrazole, 1-methyl-5-methylamino tetrazole, 1-methyl-5-dimethylamino tetrazole, 5-amino-2-methyl tetrazole, 5-amino-1-ethyl tetrazole, 1,5-diamino tetrazole, 5-amino-1-benzyl tetrazole, a derivative having other substituent and hydrates thereof.

Moreover, the 5-amino tetrazole and 5-amino tetrazole derivative are preferably 5-amino tetrazole or derivatives having a short chain alkyl groups such as methyl group, ethyl group and the like.

The 1-amino-1,2,3-triazole derivative is preferably 1-amino-1,2,3-triazole, 1-amino-5-methyl-1,2,3-triazole, 1-benzamido-4-methyl-1,2,3-triazole, 2-amino-4,5-dimethyl-1,2,3-tirazole and the like.

The photosensitive dry film used in the invention can be commercially available dry films such as H-9300 series and H-6200 series made by Hitachi Kasei Kogyo Co., Ltd., SF100 seires made by E.I. DuPont, AIPHO made by Nichigo Morton Co., Ltd., a photosensitive resin composition disclosed in JP-A-2004-317874 (a photosensitive resin composition comprising a binder polymer containing (metha)acrylic acid ester with a branched or cyclic saturated hydrocarbon group having 9 or more carbons as a copolymerizing component, a photopolymerizable compound having an ethylenically unsaturated bond and a photopolymerization initiator) and the like.

A method of applying the nitrogen-containing heterocyclic compound onto the photosensitive dry film can be either one of (I) a method of spraying a solution containing the nitrogen-containing heterocyclic compound (30-80° C.) through a spray, a shower or the like; (II) a method of immersing the photosensitive dry film in this solution; (III) a method of applying the solution with a brush, a sponge or the like; (IV) a method of applying the solution with a coating device such as roll coater, α-coater or the like; and so on. Moreover, the solution is applied onto the surface of the dry film and thereafter washed with water and dried at such a temperature that the dry film is not cured.

As a solvent for the solution containing the nitrogen-containing heterocyclic compound is preferably water. The concentration of the solution is at least 0.05 wt %, preferably 0.1-10 wt %, more preferably 3-8 wt %. When the concentration of the solution is less than 0.05 wt %, the effect of improving the adhesion between the photosensitive dry film and the thin-film conductor layer can not be obtained sufficiently, and hence if L/S is made fine, the contact area between the plating resist and the thin-film conductor layer becomes small and hence the plating resist (pattern portion of the dry film) is not retained in the development.

On the other hand, when the concentration of the solution exceeds 10 wt %, the connection reliability at the via-hole portion and the adhesion strength between the thin-film conductor layer and the electric plated portion as mentioned later unfavorably becomes lower. That is, when the circuit formation is carried out by a semi-additive method, the electric plated layer (conductor circuit) is formed on the peeled portion of the dry film (portion not forming the plating resist), but when the concentration of the nitrogen-containing heterocyclic compound exceeds 10 wt %, the nitrogen-containing heterocyclic compound may not be removed together with the dry film and may remain on the thin-film conductor layer. When the nitrogen-containing heterocyclic compound remains on the thin-film conductor layer, since the nitrogen-containing heterocyclic compound is an organic substance, the electric plated portion precipitates on the thin-film conductor layer through the nitrogen-containing heterocyclic compound, and hence the adhesion between the thin-film conductor layer and the electric plated portion (conductor circuit) is reduced. Also, when the concentration of the solution exceeds 10 wt %, the adhesion strength between the dry film and the thin-film conductor layer becomes too high and hence there may be caused a problem that the dry film can not be peeled in the development.

Since the said solution assists the formation of the aqueous solution of 5-amino tetrazole or the like and is uniformly applied to the surface of the dry film, a water-soluble solvent such as an alcohol, a non-ionic surfactant such as a polyether, ethylene oxide-propylene oxide copolymer (pluronic type), and an amino-based polyether; a metal salt such as sodium sulfate, ammonium sulfate, and ammonium chloride; ammonia and the like can be properly added to the said solution.

FIGS. 1A-1D are section views illustrating each part of production steps in a multilayer printed wiring board using a production method of the invention. In the production method of the multilayer printed wiring board according to the invention, as shown in FIG. 1, a layer 22 of a nitrogen-containing heterocyclic compound is previously formed on a photosensitive dry film 18 and thereafter attached to a thin-film conductor layer 112. For this end, the thin-film conductor layer 112 and the photosensitive dry film 18 are high in the adhesion property and the swelling or the like is not caused in the photosensitive dry film 18 (see FIG. 1A). In these steps, a light is exposed through a mask 21 and the development is carried out, whereby a plating resist 103 having a rectangular form at a section can be formed without forming a gap at the bottom (see FIG. 1B). Thereafter, the electric plating is carried out, whereby there can be formed an electric plated layer 113 having an excellent adhesion property to the thin-film conductor layer and a rectangular form at a section (see FIG. 1C). Further, the plating resist 103 is peeled off and the thin-film conductor layer 112 is removed by an etching treatment, whereby a conductor circuit 105 having an excellent adhesion property to an interlaminar resin insulating layer or a solder resist layer can be formed without the possibility of the occurrence of short-circuiting between adjoining conductor circuits (see FIG. 1D).

Next, such a preferable production method of the multilayer printed wiring board according to the invention will be described in the process of the steps.

(I) At first, a wiring board having an underlayer conductor circuit is prepared on a surface of a resin substrate. The resin substrate is preferably a resin substrate having inorganic fibers, for example, a glass cloth epoxy resin, a glass cloth polyimide substrate, a glass cloth bismaleimide-triazine resin substrate, a glass cloth resin substrate and the like. A copper clad laminate obtained by attaching a copper foil to each surface of the resin substrate may also be used.

In general, a through-hole is formed in the resin substrate with a drill, and the wall face of the through-hole and the surface of the copper foil are subjected to an electroless plating to form a connecting path. The electroless plating is preferably a copper plating. Further, an electric plating may be conducted for thickening the copper foil. The electric plating is preferably a copper plating. Thereafter, the inner wall face of the through-hole or the like is subjected to a roughening treatment, and a resin paste or the like is filled into the through-hole, whereby an electric conductive layer covering the surface thereof may be formed by an electroless plating or electric plating.

The method of the roughening treatment, for example, can be a blackening (oxidation)-reducing treatment, a spraying treatment with an aqueous mixed solution of an organic acid and a copper complex, Cu—Ni—P needle-like alloy plating and the like. Through the above steps, an etching resist is formed on a solid pattern of copper formed on the full surface of the substrate by means of a photolithography and then the underlayer conductor circuit is formed by an etching. Thereafter, a resin or the like may be filled in a concave portion of the conductor circuit formed through the etching, if necessary.

(II) Next, the formed underlayer conductor circuit is subjected to a roughening treatment, if necessary. The method of the roughening treatment can be one of the above mentioned methods, i.e. a blackening (oxidation)-reducing treatment, a spraying treatment with an aqueous mixed solution of an organic acid and a copper complex, Cu—Ni—P needle-like alloy plating and the like. Another method will be soaking the substrate on which the underlayer conductor circuit is formed into a solution dissolving a resin component therein without subjecting the underlayer conductor circuit to the roughening treatment, whereby a layer composed of resin may be formed on the surface of the underlayer conductor circuit to ensure the adhesion property to an interlaminar resin insulating layer to be formed thereon.

(III) Then, an interlaminar resin insulating layer is formed on each surface of the wiring board having the underlayer conductor circuit formed in the item (II). A material of the interlaminar resin insulating layer can be a thermosetting resin, a thermoplastic resin, a resin obtained by photosensitizing a part of the thermosetting resin and a composite resin thereof. The interlaminar resin insulating layer may be formed by applying an uncured resin or may be formed by hot-pressing an uncured resin film. Furthermore, a resin film obtained by forming a metal layer such as a copper foil on the one-side surface of the uncured resin film may be applied. In case of using such a resin film, the metal layer corresponding to the via-hole forming portion is etched and exposed to a laser beam to form an opening. The resin film provided with the metal layer can be a copper foil provided with the resin or the like.

The material for the interlaminar resin insulating layer can be, for example, a polyolefin-based resin, a polyphenylene-based resin (PPE, PPO or the like), a fluorine-based resin and so on. The polyolefin resin can be, for example, polyethylene, polypropylene, polyisobutylene, polubutadiene, poluisoprene, 2-norbornene, 5-ethylidene-2-norbornene and copolymers of these resins. The fluorine-base resin can be, for example ethyl/tetrafluoroethylene copolymer resin (ETFE), polychlorotrifluoroethylen (PCTFE) and the like.

In addition to the above materials, an adhesive for the electroless plating may be used. The adhesive for the electroless plating is the most desirably formed by dispersing cured heat-resistant resin particles soluble in an acid or an oxidizing agent into an uncured heat-resistant resin hardly soluble in an acid or an oxidizing agent. In this case, the heat-resistant resin particles are dissolved and removed by treating with the acid or the oxidizing agent, whereby roughened surface made of octopus-shaped anchors can be formed on the surface.

In the adhesive for the electroless plating, as the cured heat-resistant resin particles, it is desirable to use (a) heat-resistant resin powder having an average particle size of not more than about 10 µm, (b) aggregate particles obtained by aggregating heat-resistant resin powder having an average particle size of not more than 2 µm, (c) a mixture of heat-resistant resin powder having an average particle size of about 2-10 µm and heat-resistant resin powder having an average particle size of not more than about 2 µm, (d) false particles obtained by adhering at least one selected from heat-resistant resin powder and inorganic powder having an average particle size of not more than about 2 µm to surfaces of heat-resistant resin powder having an average particle size of about 2-10 µm, (e) a mixture of heat-resistant resin powder having an average particle size of about 0.1-0.8 µm and heat-resistant resin powder having an average particle size of more than about 0.8 µm but less than 2 µm, or (f) heat-resistant resin powder having an average particle size of about 0.1-1.0 µm. The reason is that these powders can form more complicated anchors.

The uncured heat-resistant resin hardly soluble in the acid or the oxidizing agent is preferably "resin composite of a thermosetting resin and a thermoplastic resin", "resin composite of a photosensitive resin and a thermoplastic resin" or the like. The former is high in the heat resistance, and the latter can form an opening for via-hole through a photolithography.

The thermosetting resin can be, for example, an epoxy resin, a phenolic resin, a polyimide resin and the like. The photosensitive resin can be the one obtained by acrylating a thermosetting group with methacrylic acid or acrylic acid. Particularly, an acrylated epoxy resin is optimum. The epoxy resin can be an epoxy resin of a novolac type such as phenol novolac type, cresol novolac type or the like, an alicyclic epoxy resin modified with dicyclopentadiene and the like.

The thermoplastic resin can be, for example, phenoxy resin, polyethersulfone (PES), polysulfon (PSF), polypheylenesulfon (PPS), polyphenylene sulfide (PPES) polyphenyl ether (PPE), polyether imide (PI), fluorine resin and the like. The mixing ratio of the thermosetting resin (photosensitive resin) to the thermoplastic resin is preferably thermosetting resin (photosensitive resin)/thermoplastic resin=95/5-50/50. This can ensure a high toughness value without damaging the heat resistance.

The mixing weight ratio of the heat-resistant resin particles is preferably about 5-50 wt %, more preferably about 10-40 wt % per a solid content of the heat-resistant resin matrix. As the heat-resistant resin particles, it is desirable to use an amino resin (melamine resin, urea resin, guanamine resin), an epoxy resin or the like.

(IV) Then, the interlaminar resin insulating layer is cured, while an opening for via-hole is formed by subjecting the interlaminar resin insulating layer to light exposure and development treatments or a laser treatment. The opening of the interlaminar resin insulating layer is carried out by using a laser beam or an oxygen plasma when the resin matrix in the adhesive for the electroless plating is a thermosetting resin, a polyolefin-based resin, a cycloolefin-based resin or the like, and by the light exposure-development treatment when it is a photosensitive resin. Moreover, the light exposure-development treatment is carried out by attaching a photomask (preferably a glass substrate) depicted with a circle pattern for the formation of the opening for via-hole firmly to the interlaminar resin insulating layer, so as to make the circle pattern side and the photosensitive side of the interlaminar resin insulating layer sticking to each other, exposing a photomask to the light and soaking it into a developing solution or spraying the developing solution on it. The interlaminar resin insulating layer formed on the conductor circuit which has a roughened surface of a sufficient unevenness is cured, whereby the interlaminar resin insulating layer having an excellent adhesion property to the conductor circuit can be formed.

When the opening for via-hole is formed by using a laser beam, carbon dioxide gas ($CO_2$) laser, ultraviolet ray laser, excimer laser, YAG laser and the like are used as the laser beam. Among them, the excimer laser and a short-pulse carbon dioxide gas laser are preferable.

The excimer laser can form many openings for via-holes at once by using a mask provided with through-holes formed corresponding to the openings for via-holes as mentioned later, while the short-pulse carbon dioxide gas laser lessens the resin residue and the damage to the resin in the vicinity of the opening.

As the excimer laser, it is desirable to use an excimer laser of a hologram system. The hologram system means a system that the laser beam is irradiated to a target through a hologram, condenser lens, a laser mask, transfer lens and the like. By using this system, many openings can be efficiently formed in the interlaminar resin insulating layer at once.

In case of using the carbon dioxide gas laser, the pulse interval is preferably about $10^{-4}$-$10^{-8}$ second. Also, the laser irradiating time for the formation of the opening is preferably about 10-500 µseconds. The through-hole formed in the mask corresponding to the opening for via-hole needs to be a true circle for rendering the spot form of the laser beam into true circle, and the diameter of the through-hole is preferably about 0.1-2 mm.

In case of forming the opening through the laser beam, it is desirable to conduct the desmear treatment particularly when the carbon dioxide gas laser is used. The desmear treatment may be carried out by using an oxidizing agent made from an aqueous solution of chromic acid, permanganate or the like. Also, the treatment may be carried out by an oxygen plasma, a $CF_4$-oxygen mixed plasma, a corona discharge or the like. Further, the surface modification may be carried out by irradiating ultraviolet ray with a low-pressure mercury lamp.

(V) Next, the surface of the interlaminar resin insulating layer provided with the openings for via-holes is roughened, if necessary. When the interlaminar resin insulating layer is formed by using the adhesive for electroless plating, the roughening of the interlaminar resin insulating layer is carried out by dissolving and removing heat-resistant resin particles existing on the surface of the adhesive layer for electroless plating with an acid or an oxidizing agent. In order to ensure the adhesion property to the conductor circuit, the height of the roughened surface formed by the acid treatment or the like is preferably Rmax=about 0.01-20 μm. Particularly, it is more preferable if it is about 0.1-5 μm in the semiadditive method in order to remove the metal layer and ensure the adhesion property at the same time.

For the acid treatment, phosphoric acid, hydrochloric acid, sulfuric acid, or an organic acid such as formic acid, acetic acid is preferable, and the organic acid is particularly preferable. This is due to the fact that the organic acid hardly corrodes the metal conductor layer exposed from the via-hole in the roughening treatment. In the oxidizing treatment, it is desirable to use chromic acid, permanganate (potassium permanganate or the like) and the like.

(VI) Next, a thin-film conductor layer made from a metal such as Cu, Ni, P, Pd, Co, W or the like is formed on the surfaces of the interlaminar resin insulating layer and the opening for via-hole. The thin-film conductor layer may be made from a single metal or from two or more metals. The thin-film conductor layer may also be one layer or may be two or more layers. The thickness of the thin-film conductor layer is preferably about 0.1-5 μm, more preferably about 0.5-2 μm. Further, the thin-film conductor layer is desirably formed by sputtering, plating or a combination of sputtering and plating.

(VII) After the photosensitive dry film previously coated with the nitrogen-containing heterocyclic compound is attached to either surface, a plating resist is formed on the thin-film conductor layer by light exposure-development treatment.

(VIII) The thin-film conductor layer formed on the interlaminar resin insulating layer is subjected to an electric plating as a plating lead to thicken the conductor circuit. The thickness of the plated film is preferably about 5-30 μm. As the electric plating is preferable copper plating. In this case, the opening for via-hole may be filled with the electric plated portion to have a filled via structure.

(IX) After the formation of the electric plated film, the plating resist is peeled off and the thin-film conductor layer existing below the plating resist is removed by etching to form an independent conductor circuit. The etching solution is, for example, sulfuric acid-hydrogen peroxide aqueous solution, an aqueous solution of persulfate such as ammonium persulfate, sodium persulfate, and potassium persulfate, an aqueous solution of ferric chloride or copper chloride, hydrochloric acid, nitric acid, a hot diluted sulfuric acid and so on. The roughened surface can also be formed at the same time when etching is conducted between the conductor circuits by applying an etching solution containing the copper complex and organic acid.

(X) The steps (III)-(IX) are repeated, if necessary, and further the conductor circuit of the outermost layer is subjected to an electroless plating or etching under the same conditions as in the step (III) to form a roughened layer or roughened surface on the conductor circuit of the outermost layer.

Then, a solder resist resin composition is applied onto the surface of the substrate inclusive of the outermost conductor circuit by a roll coater method or the like and subjected to an opening treatment and a curing treatment through laser treatment, light exposure and development to form a solder resist layer. Thereafter, a solder bump is formed in opening portions of the solder resist layer to terminate the production of the printed wiring board.

At this step, a letter printing for forming product recognition characters, or a plasma treatment with oxygen, carbon tetrachloride or the like for modifying the solder resist layer may be conducted properly. Although the above method is based on the semi-additive method, a full-additive method may be adopted.

EXAMPLES

Example 1

The invention will be described in detail with reference to the following examples below.

(A) Preparation of Scale-Like Particle-Containing Kneaded Mass

To a mixed solvent of 20 g of methylethyl ketone (hereinafter referred to as "MEK") and 80 g of xylene is added 15 g of scale-like particles (trade name: Esben C, made by Houjunn Corp., aspect ratio in dispersion: 500 or less than 500, crystal size: 0.5 μm or less than 0.5 μm), which are kneaded through three rollers to form a scale-like particle-containing kneaded mass.

(B) Preparation of Epoxy-Containing Solution

To a mixed solvent of 6.8 g of MEK and 27.2 g of xylene is added and mixed 85 g of solid epoxy resin (trade name: Epicoat 1007, made by Japan Epoxy Resin Co., Ltd.) to form an epoxy containing solution.

(C) Preparation of Resin Film for Interlaminar Resin Insulating Layer

The scale-like particle-containing kneaded mass prepared in the item (A), the epoxy containing solution prepared in the item (B), dicyandiamide (trade name: CG-1200, made by B.T.I. Japan Co., Ltd. 3.3 g per 100 g of solid epoxy content) as a curing agent and a curing catalyst (trade name: Curazol 2E4HZ, made by Shikoku Kasei Co., Ltd. 3.3 g per 100 g of solid epoxy content) are kneaded through three rolls to obtain an adhesive solution.

The adhesive solution is applied onto a polyethylene terephthalate sheet with a roll coater (made by Thermatornic Boeki Co., Ltd.) and thereafter dried under heating at 160° C. for 5 minutes to remove the solvent, whereby there is prepared an insulating film having a thickness of 40 μm.

The insulating film has a minimum crystal size of 0.1 μm as measured at dispersion by a transparent type electron microscope (50,000-100,000 magnification) and an aspect ratio of 100-500.

(D) Preparation of Resin Filler 100 parts by mass of bisphenol F-type epoxy monomer (YL983U, made by Yuka Shell Co., Ltd. molecular weight: 310), 170 parts by mass of $SiO_2$ spherical particles coated with a silane coupling agent and having an average particle size of 1.6 μm and a maximum particle diameter equal to or less than 15 μm (CRS 1101-CE, made by Adtec Co., Ltd.) and 1.5 parts by mass of a leveling agent (Pelenol S4, made by Sunnopco Co., Ltd.) are placed in a vessel and mixed with stirring to prepare a resin filler having a viscosity at 23±1° C. of 45-49 Pa·s. Moreover, 6.5 parts by mass of an imidazole curing agent (2E4MZ-CN, made by Shikoku Kasei Co., Ltd.) is used as a curing agent.

(E) Preparation of Dry Film

A solution of a photosensitive resin composition (photosensitive resin composition disclosed in JP-A-2004-317874 or the like) is uniformly applied onto the polyethylene terephthalate sheet and dried in a hot air convection drier of 100° C. for 10 minutes, which is soaked in a solution of 0.05 wt % 5-aminotetrazole (30-80° C.) for 1 minute to prepare a dry film adhered on its surface with 5-aminotetrazole. Moreover, the base film (polyethylene terephthalate film) is peeled off prior to the development. Also, when the commercially available dry film is used, it is soaked in a solution of 5-aminotetrazole after the peeling of the cover film.

(F) Preparation of Multilayer Printed Wiring Board

The production steps (1)-(9) of the multilayer printed wiring board are explained with reference to FIGS. 2A-2E.

Figures 1A, 1B, 1C:
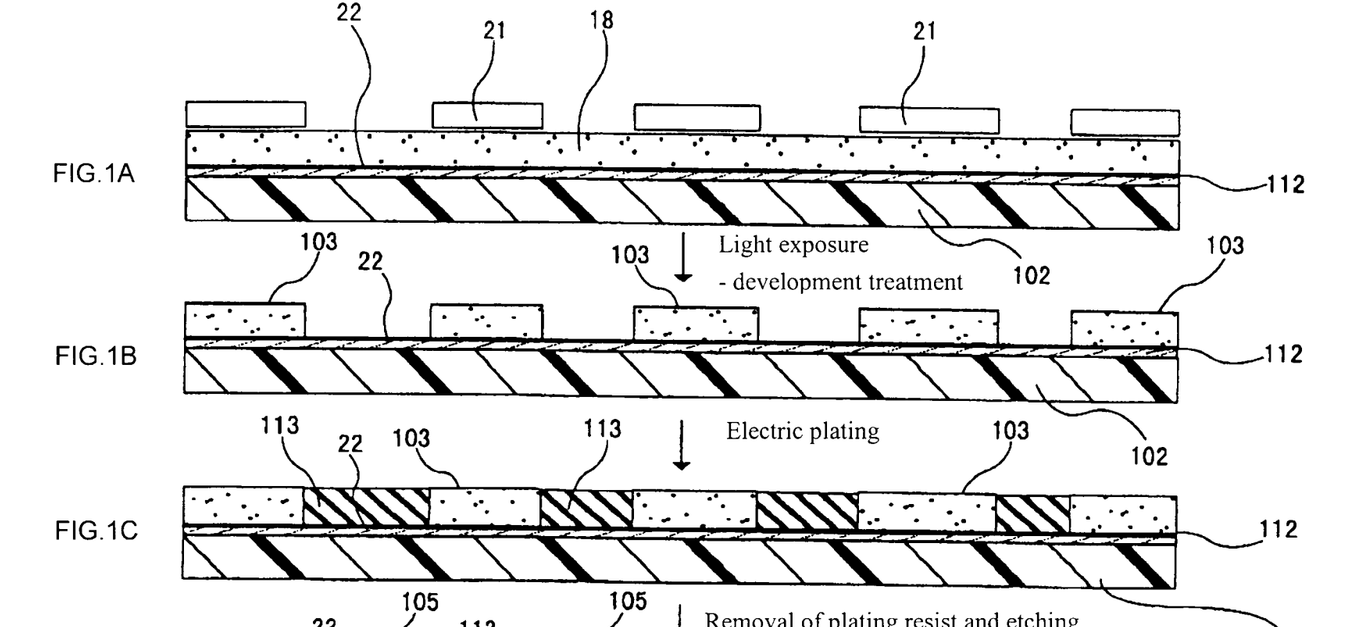
FIGS. 1A-1D are section views illustrating each part of production steps in a multilayer printed wiring board using a production method of the invention.
Figure 1D:
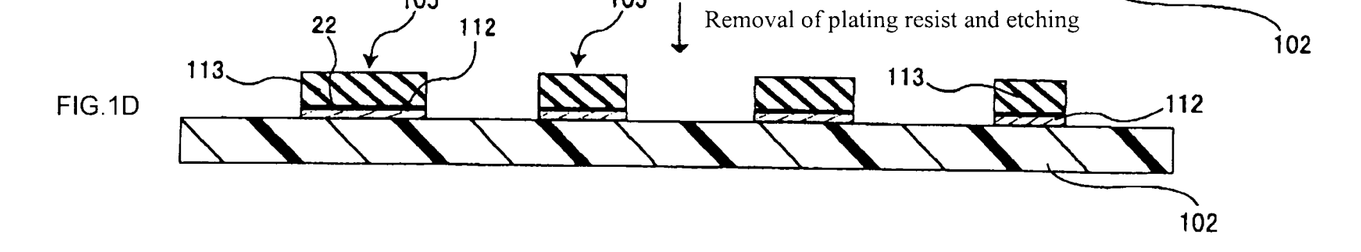
Figure 2A:
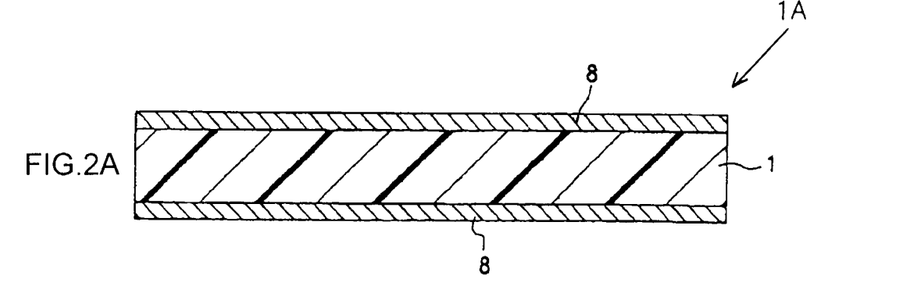
FIGS. 2A-2D are section views illustrating each part of production steps in a multilayer printed wiring board using a production method of the invention.
Figure 2B:
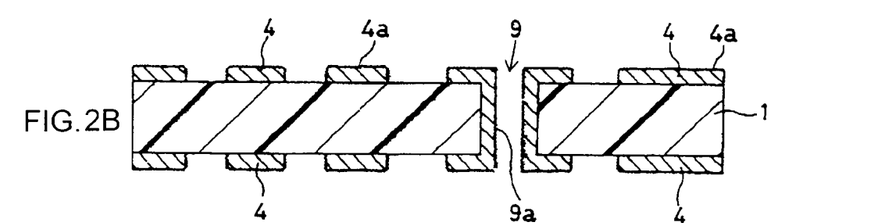

Step (1): A copper-clad laminate 1A formed by laminating a copper foil of 20 μm to each surface of a substrate 1 made of a glass epoxy resin or BT (bismaleimide triazine) having a thickness of 0.8 mm is used as a starting material (FIG. 2A). At first, the copper-clad laminate 1A is pierced with a drill and subjected to an electroless plating and an electrolytic plating treatments and etched in the forma of a pattern to form an underlayer conductor circuit 4 and a through-hole 9 on both surfaces of the substrate 1 (FIG. 2B).

Step (2): The substrate 1 provided with the through-hole 9 and underlayer conductor circuit 4 is washed with water and dried and subjected to a blackening treatment with an aqueous solution containing NaOH (10 g/l), NaClO$_2$ (40 g/l) and Na$_3$PO$_4$ (6 g/l) as a blackening bath and a reducing treatment with an aqueous solution containing NaOH (10 g/l) and NaBH$_4$ (6 g/l) as a reducing bath, whereby roughened surfaces 4a, 9a are formed on a whole surface of the underlaywer conductor circuit 4 inclusive of the through-hole 9 (FIG. 2B).

Figure 2C:
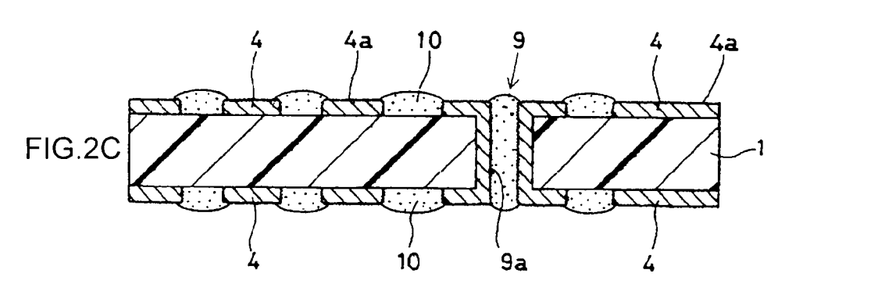
Figure 2D:
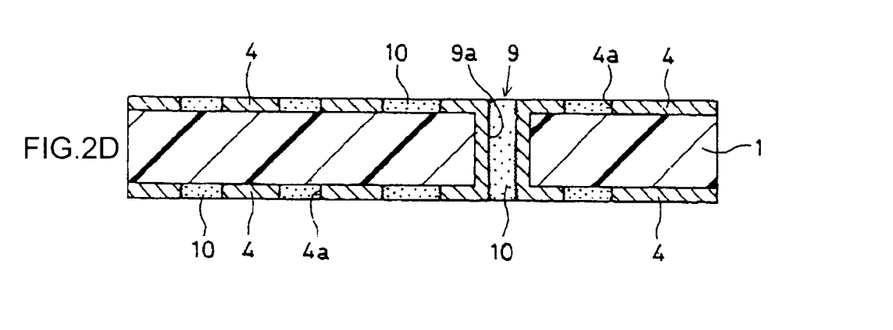

Step (3): Within 24 hours after the preparation of the resin filler as described in the item (D), a layer of the resin filler 10 is formed in the through-hole 9 and a portion not forming the underlayer conductor circuit 4 on the one-side surface of the substrate 1. That is, the resin filler 10 is pushed into the through-hole 9 with a squeeze and dried at 100° C. for 20 minutes. Then, a mask having an opening corresponding to the portion not forming the underlayer conductor circuit 4 is placed on the substrate 1 and the layer of the resin filler 10 is formed in the portion not forming the underlayer conductor circuit 4 as a recess portion with the squeeze and dried at 100° C. for 20 minutes (FIG. 2C).

Step (4): The one-side surface of the substrate 1 after the treatment of the item (3) is polished by belt sander polishing with #600 belt polishing paper (made by Sankyo Rikagaku Co., Ltd.) so as not to leave the resin filler 10 on the surface of the underlayer conductor circuit and the land surface of the through-hole 9 and then subjected to a buffing for removing flaws generated by the above belt sander polishing. Similarly, such a series of the polishing are applied to the other surface of the substrate 1. Then, the resin filler 10 is cured by subjecting to heating treatments at 100° C. for 1 hour and at 150° C. for 1 hour.

Thus, the surface layer portion of the resin filler 10 formed in the through-hole 9 and the portion not forming the underlayer conductor circuit 4 and the surface of the underlayer conductor circuit 4 are flattened to obtain an insulating substrate in which the resin filler 10 is strongly adhered to the underlayer conductor circuit 4 and the through-hole 9 through the roughened surfaces 4a, 9a. That is, the surface of the resin filler 10 and the surface of the underlayer conductor circuit 4 become the same plane.

Figure 3A:
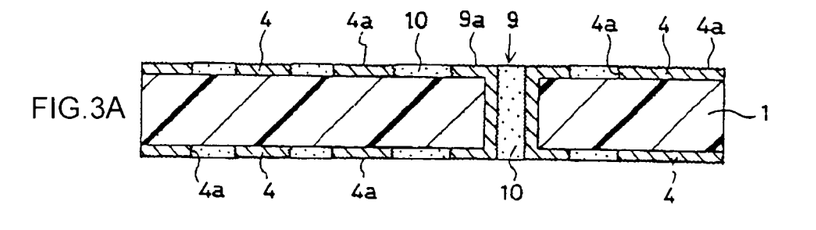
FIGS. 3A-3D are section views illustrating each part of production steps in a multilayer printed wiring board using a production method of the invention.

Step (5): After the substrate 1 is washed with water and applied by acidic degreasing, it is soft-etched and then an etching solution is sprayed on both surfaces of the substrate 1 to etch the surface of the underlayer conductor circuit 4 and the land surface of the through-hole 9, whereby roughened surfaces 4a, 9a are formed on the whole surface of the underlayer conductor circuit 4 and the land surface of the through-hole 9 (FIG. 3A). The etching solution is an etching liquid comprised of 10 parts by mass of imidazole copper (II) complex, 7 parts by mass of glycolic acid and 5 parts by mass of potassium chloride (Mec Etch Bond, made by Mec Co., ltd.).

Figure 3B:
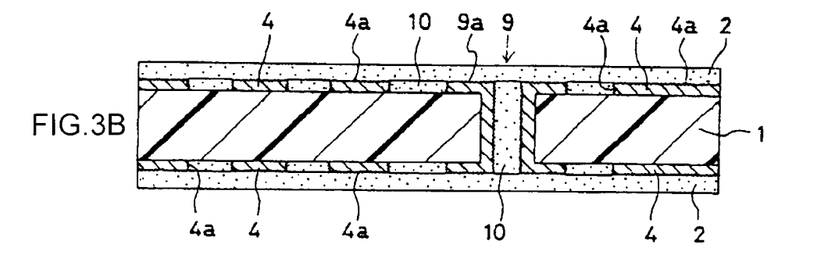

Step (6): A resin film 2 for an interlaminar resin insulating layer having an area slightly larger than that of the substrate 1 (prepared in the item (C)) is placed on each surface of the substrate 1 and pre-pressed under conditions of pressure: 4 kgf/cm$^2$, temperature: 80° C. and pressing time: 10 seconds, and then cut and further pressed under conditions of vacuum degree: 0.5 Torr, pressure; 4 kgf/cm$^2$, temperature: 80° C. and pressing time: 60 seconds with a vacuum laminator device (FIG. 3B).

Figure 3C:
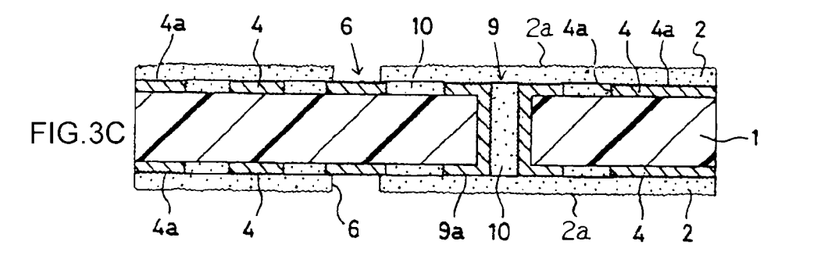

Step (7): An opening 6 for via-hole having a diameter of 40-70 μm is formed in the interlaminar resin insulating layer 2 by irradiating a carbon dioxide gas laser having a wavelength of 10.4 μm to the interlaminar resin insulating layer 2 under conditions of beam diameter: 4.0 mm, top hat mode, pulse width: 10-20 μsecond, diameter of through-hole in the mask: 1.0-2.2 mmϕ and 1-3 shots (FIG. 3C).

Figure 3D:
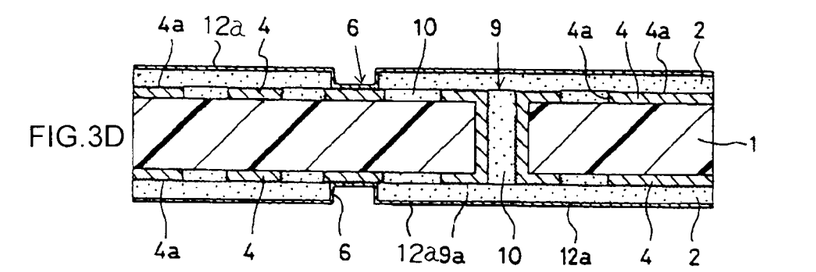

Step (8): The substrate 1 is soaked in a swelling liquid, washed with water and soaked in a solution of 80° C. containing 60 g/l of permanganic acid for 10 minutes, whereby flaky particles are dropped off from the surface of the interlaminar resin insulating layer to form a roughened surface 2a on the surface of the interlaminar resin insulating layer inclusive of the inner wall of the opening 6 for via-hole (FIG. 3C). The roughness of the roughened surface is 0.01-2 μm. Then, the substrate 1 after the above treatment is soaked in a neutral solution (made by Shiplay Co., Ltd.) and washed with water. Thereafter, it may be subjected to a desmear treatment for removing residues of the resin and particles retained in the bottom of the via-hole by a physical method such as O$_2$ plasma, CF$_4$ plasma or the like. Further, a palladium catalyst is given to the surface of the substrate 1 after the roughening treatment, whereby a catalyst nucleus 12a is adhered to the surface of the interlaminar resin insulating layer 2 and the inner wall surface of the opening 6 for via-hole (FIG. 3D).

Figure 4A:
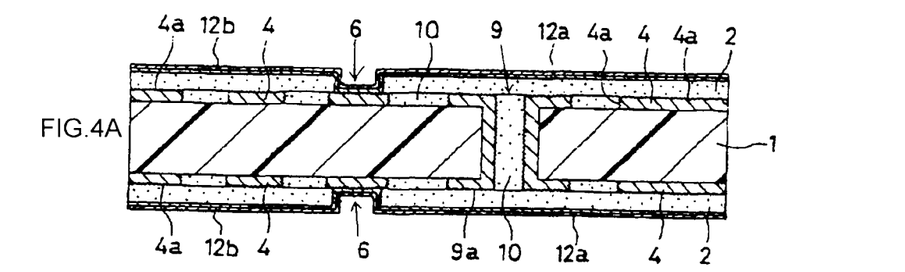
FIGS. 4A-4D are section views illustrating each part of production steps in a multilayer printed wiring board using a production method of the invention.

Step (9): The substrate provided with the catalyst is soaked in an aqueous electroless copper plating solution of 34° C. having the following composition for 40 minutes to form an electroless copper plated film having a thickness of 0.6-2.0 μm on the whole of the roughened surface, whereby there is obtained a substrate in which the electroless copper plated film is formed on the surface of the interlaminar resin insulating layer inclusive of the inner wall of the opening 6 for via-hole (FIG. 4A).

(Electroless Copper Plating Solution)

Copper sulfate: 0.03 mol/l
EDTA: 0.20 mol/l
HCHO: 0.18 g/l

NaOH: 0.10 mol/l
α,α'-bipyridyl: 100 mg/l
Polyethylene glycol: 0.10 g/l

Figure 4B:
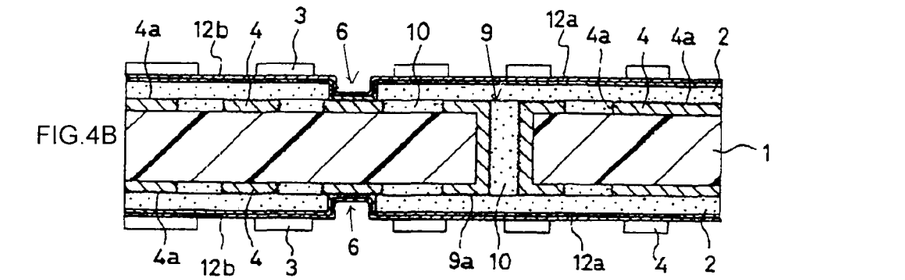

Step (10): The dry film prepared in the item (E) is attached to the substrate provided with the electroless copper plated film 12b under conditions of 50-150° C. and 5-10 kg/cm² and a mask is placed thereon and subjected to light-exposure-development to form a patterned plating resist 3 (FIG. 4B). Moreover, as the mask is used a mask pictured with a pattern of L/S (L: remaining portion of the plating resist, S: portion not forming the plating resist)=5/5-15/15 (interval of L/S: 2.5 μm).

Figure 4C:
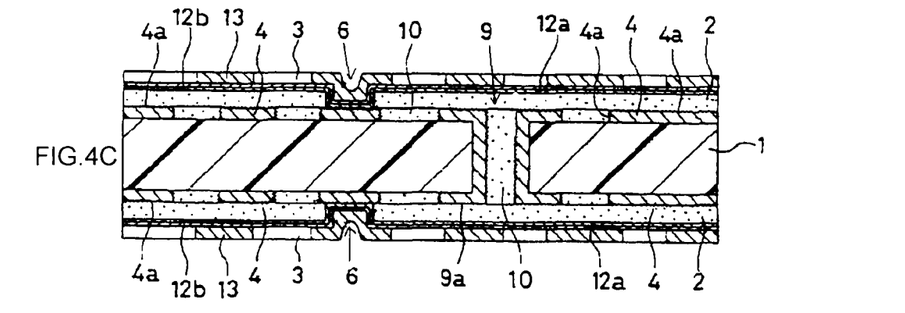

Step (11): The substrate 1 is subjected to an electrolytic plating to form an electrolytic copper plated film 13 having a thickness of 5-12.5 μm in the portion not forming the plating resist 3 (S portion) (FIG. 4C). Moreover, the plating is carried out under the following plating solution and conditions to obtain an electrolytic copper plated film 13 of 15 μm.
(Electryltic Copper Plating Solution)
Sulfuric acid: 2.24 mol/l
Copper sulfate: 0.26 mol/l
Additive: 19.5 ml/l
(trade name: Capalacid GL, made by Atotec Japan Co., Ltd.)
(Electrolytic Plating Conditions)
Current density: 1 A/dm²
Time: 55±5 minutes
Temperature: 22±2° C.

Figure 4D:
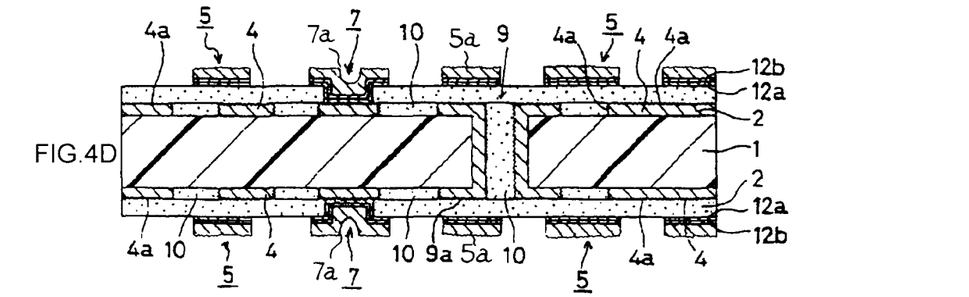
Figure 5A:
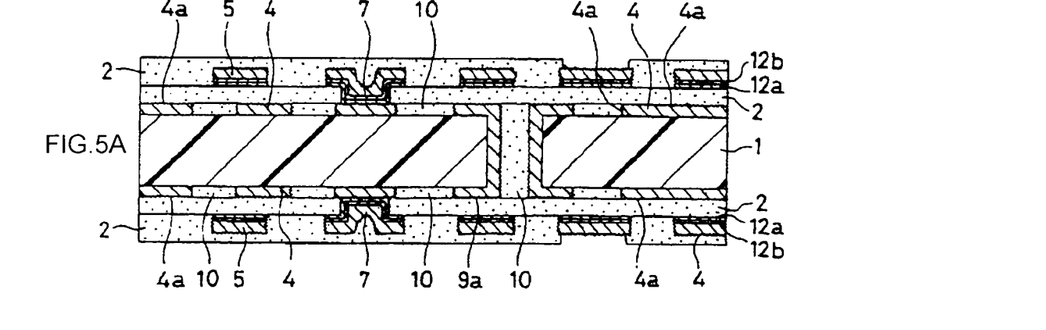
FIGS. 5A-5C are section views illustrating each part of production steps in a multilayer printed wiring board using a production method of the invention.
Figure 5B:
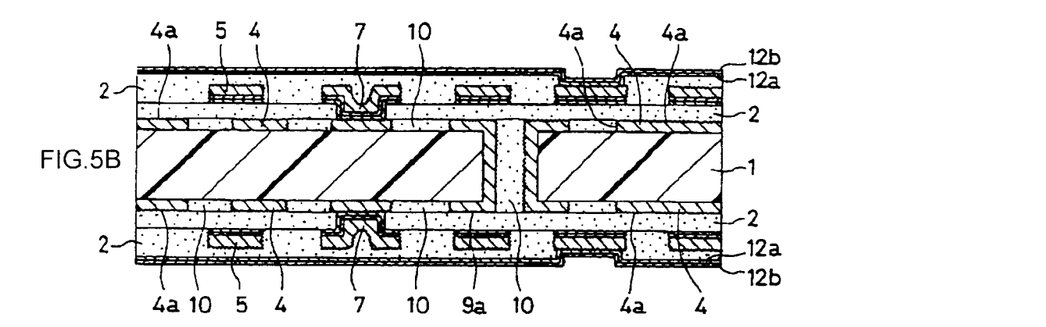
Figure 5C:
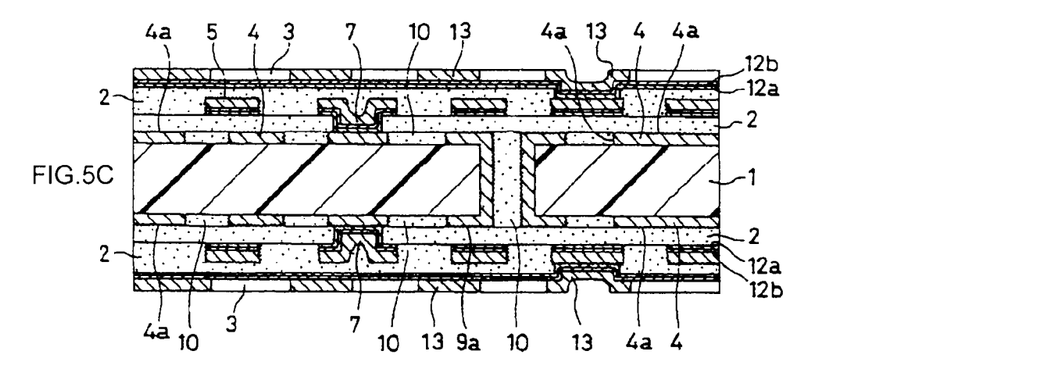

Step (12): Further, the plating resist 3 is peeled and removed with about 5% KOH, and thereafter the electroless plated film 12b beneath the plating resist 3 is dissolved off by etching with a mixed solution of sulfuric acid and hydrogen peroxide to form independent conductor circuit 7 and via-hole 7 (FIG. 4D).

Step (13): Then, roughened surfaces 5a, 7a are formed on the surfaces of the conductor circuit 5 and through-hole 7 by a surface roughening treatment (e.g. Mec Etch Bond Cz-8100, made by Mec Co., Ltd.) (FIG. 4D).

Step (14): Further, an upper layer conductor circuit is formed by repeating the steps (5)-(13), whereby a multilayer printed wiring board is obtained (FIG. 5A-FIG. 6B).

Figure 6A:
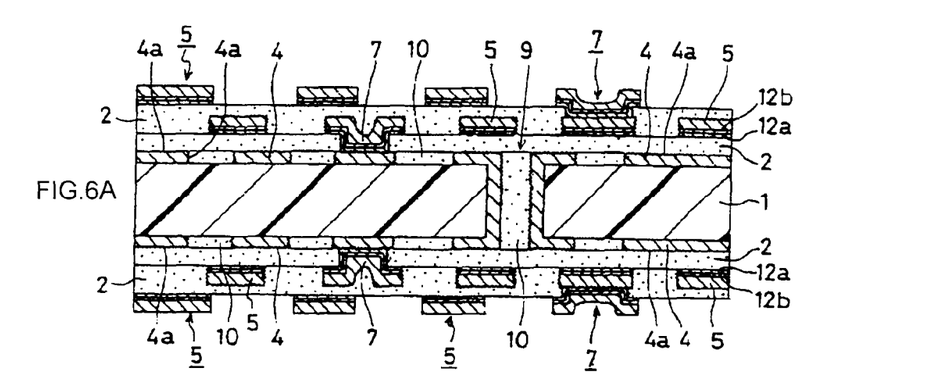
FIGS. 6A-6C are section views illustrating each part of production steps in a multilayer printed wiring board using a production method of the invention.
Figure 6B:
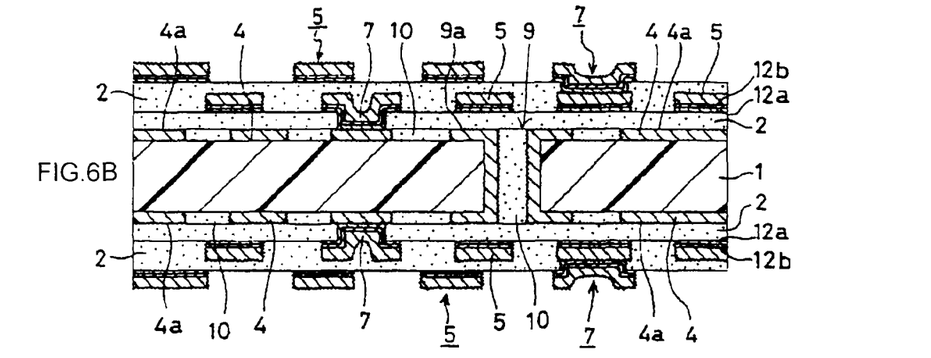
Figure 6C:
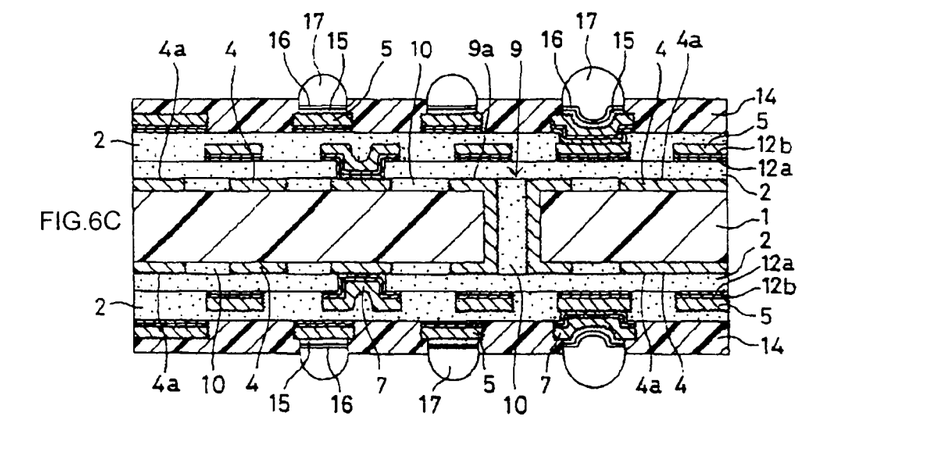

Step (15): Then, a commercially available solder resist composition is applied onto each surface of the multilayer printed wiring board at a thickness of 12-30 μm and subjected to a drying treatment at 70° C. for 20 minutes or at 70° C. for 30 minutes to form a solder resist layer 14 (FIG. 6C). Thereafter, a photomask of 50 mm in thickness pictured with a pattern of solder resist openings is closed to the solder resist layer 14 and exposed to an ultraviolet ray of 1000 mJ/cm² and developed with a DMTG solution to form openings having a diameter of 200 μm.

Next, the solder resist layer 14 is cured by heat treatments under conditions of at 80° C. for 1 hour, at 100° C. for 1 hour, at 120° C. for 1 hour and at 150° C. for 3 hours to form a solder resist patterned layer having a thickness of 10-25 μm, respectively, to form a solder resist pattern layer.

Step (16): The substrate provided with the solder resist layer 14 is soaked in an electroless nickel plating solution to form a nickel plated layer 15 of 5 μm in thickness on the opening portions. Further, the substrate is soaked in an electroless gold plating solution to form a gold plated layer 16 of 0.03 μm in thickness on the nickel plated layer 15 (FIG. 6C). A monolayer of tin, noble metal (gold, silver, palladium, platinum or the like) may be formed instead of the nickel-gold layer.

Step (17): Thereafter, a solder paste is printed on the openings in the solder resist layer 14 and reflowed at 200° C. to form a solder bump 17, whereby prepare a multilayer printed wiring board having the solder on the solder bumps FIG. 6C).

Examples 2-5

Multilayer printed wiring boards are prepared in the same manner as described above except that the concentration of the solution containing 5-aminotetrazole is 1 wt %, 3 wt %, 8 wt % or 10 wt % in the step (E) of preparing the dry film.

Example 6

A multilayer printed wiring board is prepared in the same manner as in Example 1 except that 5-amino-1,2,3-methyltetrazole having a concentration of 3 wt % is used instead of 5-aminotetrazole having a concentration of 0.5 wt % in the step (E) of preparing the dry film.

Example 7

A multilayer printed wiring board is prepared in the same manner as in Example 1 except that 5-amino-1-methyltetrazole having a concentration of 3 wt % is used instead of 5-aminotetrazole having a concentration of 0.5 wt % in the step (E) of preparing the dry film.

Comparative Example 1

Comparative Example 1 is a case that a nitrogen-containing heterocyclic compound is not applied in the step (E) of preparing the dry film.

Comparative Example 2

Comparative Example 2 is a case that a nitrogen-containing heterocyclic compound is not applied in the step (E) of preparing the dry film and a solution containing 3 wt % of 5-aminotetrazole is applied onto a thin film conductor layer and washed with water and dried (which is conducted between the step (10) and the step (11)).

Reference Example 1, Reference Example 2

In Reference Example 1 and 2, a multilayer printed wiring board is prepared in the same manner as in Example 1 except that the concentration of the solution containing 5-aminotetrazole is 0.03 wt % and 12 wt %, respectively, in the step (E) of preparing the dry film.
(Test Method)
(Evaluation test 1) With respect to the printed wiring boards prepared in Examples 1-7, Comparative Example 1 and Reference Example 1 and 2, the state of forming the plating resist pattern of L/S is evaluated after the completion of the step (10). A case that L portion is not left and the dry film remains in S portion is "×", and a case that a floating of the plating resist (partial peeling) is observed in L portion is "Δ", and a case that L portion is closely adhered and the dry film does not remain in S portion is "○". The observation is carried out by using a microscope of 10 times magnification. The results are shown in Table 1.

As a result, in all of Examples 1-7 is not observed the floating of the dry film or the like, and the plating resist having an excellent adhesion property is formed. In Reference Example 1 and 2, the floating or peeling is observed in a part of the plating resist, which is due to the concentration of the nitrogen-containing heterocyclic compound applied to the surface of the dry film, and it leads to the understanding that the concentration of the nitrogen-containing heterocyclic compound is preferably 0.05-10 wt %. On the contrary, the nitrogen-containing heterocyclic compound is not applied to the surface of the dry film in Comparative Example 1, so that the effect of improving the adhesion property by the nitrogen-containing heterocyclic compound is not obtained and the plating resist is peeled off.

(Evaluation test 2) The printed wiring boards of Example 3 and Comparative Example 2 are charged into a heat cycle testing machine and the heat cycle test is carried out as follows.

<Heat cycle test> At first, the conduction resistance of the wiring from a measuring terminal at the back face of the printed wiring board through the wiring of the buildup layer at the back face (via-hole), the through-hole, the wiring of the buildup layer at the front face (inclusive of via-hole), the through-hole and the wiring of the buildup layer at the back face to the measuring terminal at the back face is measured, and thereafter the heat cycle test is carried out under conditions of 1000 cycles of $-55°$ C.$\times 5$ minutes$\leftrightarrows 120°$ C.$\times 5$ minutes, and the conduction resistance of the same wiring is again measured. The results are shown in Table 1. Moreover, when the variance between the value of the condition resistance of the wiring after heat cycling and the default value of the condition resistance of the wiring divided by the default value of condition resistance of the wiring times 100 is within the range of $-10$ to $+10\%$, the evaluation is "○", otherwise "x".

As a result, Example 3 is "○", but Comparative Example 2 is "x". It is inferred that in Comparative Example 2, the electrolytic copper plated film is formed on the electroless copper plated film at a state of retaining 5-aminotetrazole and that the peeling between the electroless copper plated film and the electrolytic copper plated film is caused to increase the conduction resistance.

TABLE 1

| | Nitrogen-Containing heterocyclic compound | | | | |
|---|---|---|---|---|---|
| | Kind | Concentration (wt %) | Surface applied | Evaluation Test 1 | Evaluation Test 2 |
| Example 1 | 5-Aminotetrazole | 0.05 | Dry film | ○ | — |
| Example 2 | 5-Aminotetrazole | 1 | Dry film | ○ | — |
| Example 3 | 5-Aminotetrazole | 3 | Dry film | ○ | ○ |
| Example 4 | 5-Aminotetrazole | 8 | Dry film | ○ | — |
| Example 5 | 5-Aminotetrazole | 10 | Dry film | ○ | — |
| Example 6 | 1-Amino-1,2,3-Methyl-tetrazole | 0.5 | Dry film | ○ | — |
| Example 7 | 5-Amino-1-Methyl-tetrazole | 3 | Dry film | ○ | — |
| Comparative Example 1 | None | None | None | x | — |
| Comparative Example 2 | 5-Aminotetrazole | 3 | Substrate | — | x |
| Reference Example 1 | 5-Aminotetrazole | 0.03 | Dry film | Δ | — |
| Reference Example 2 | 5-Aminotetrazole | 12 | Dry film | Δ | — |

INDUSTRIAL APPLICABILITY

The technique of the invention is utilized to the production of the multilayer printed wiring board having no fear of causing short-circuiting between adjoining conductor circuits and being excellent in the connection reliability under heat cycle condition or under high-temperature and high-humidity condition.

The invention claimed is:

1. A method of producing a multilayer printed wiring board, comprising:

forming a nitrogen compound layer comprising a nitrogen-containing heterocyclic compound on a first surface of a photosensitive dry film;

forming the photosensitive dry film on an interlaminar resin insulating layer having a thin-film conductor layer such that the nitrogen compound layer is attached to the thin-film conductor layer;

conducting a light exposure and development to form a plating resist comprising the photosensitive dry film on the thin-film conductor layer; and forming a conductor circuit on a portion of the thin-film conductor layer where the plating resist is not formed, wherein the forming of the nitrogen compound layer comprises soaking the photosensitive dry film in a solution comprising the nitrogen-containing heterocyclic compound at a concentration of 0.1 to 10 wt %.

2. A method of producing a multilayer printed wiring board according to claim 1, wherein the nitrogen-containing heterocyclic compound comprises at least one compound selected from the group consisting of pyrrole, imidazole, oxazole, thiazole, pirazole, 3-pyrroline, pyrrolidine, pyridine, pyrimidine, purine, quinoline, isoquinoline, carbazole, tetrazole, 5-aminotetrazole, triazole, aminotriazole, and a derivative thereof.

3. A method of producing a multilayer printed wiring board according to claim 1, wherein the photosensitive dry film has a base film on a second surface of the dry film on an opposite side of the nitrogen compound layer comprising the nitrogen-containing heterocyclic compound.

4. A method of producing a multilayer printed wiring board according to claim 1, wherein the nitrogen-containing heterocyclic compound is 5-aminotetrazole.

5. A method of producing a multilayer printed wiring board according to claim 1, wherein the nitrogen-containing heterocyclic compound comprises at least one of 5-amino-1-methyl tetrazole, 1-methyl-5-methylamino tetrazole, 1-methyl-5-dimethylamino tetrazole, 5-amino-2-methyl tetrazole, 5-amino-1-ethyl tetrazole, 1,5-diamino tetrazole, and 5-amino-1-benzyl tetrazole.

6. A method of producing a multilayer printed wiring board according to claim 1, wherein the nitrogen-containing heterocyclic compound comprises at least one of 1-amino-1,2,3-triazole, 1-amino-5-methyl-1,2,3-triazole, 1-benzamido-4-methyl-1,2,3-triazole, and 2-amino-4,5-dimethyl-1,2,3-tirazole.

7. A method of producing a multilayer printed wiring board according to claim 1, wherein the solution comprises the nitrogen-containing heterocyclic compound at a concentration of 3 to 8 wt %.

* * * * *